(12) United States Patent
Curatola et al.

(10) Patent No.: US 10,516,023 B2
(45) Date of Patent: Dec. 24, 2019

(54) HIGH ELECTRON MOBILITY TRANSISTOR WITH DEEP CHARGE CARRIER GAS CONTACT STRUCTURE

(71) Applicant: Infineon Technologies Austria AG, Villach (AT)

(72) Inventors: Gilberto Curatola, Villach (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/913,284

(22) Filed: Mar. 6, 2018

(65) Prior Publication Data
US 2019/0280093 A1    Sep. 12, 2019

(51) Int. Cl.
*H01L 29/417*    (2006.01)
*H01L 29/20*    (2006.01)
(Continued)

(52) U.S. Cl.
CPC ........ *H01L 29/4175* (2013.01); *H01L 21/743* (2013.01); *H01L 21/746* (2013.01); *H01L 29/2003* (2013.01); *H01L 29/205* (2013.01); *H01L 29/66462* (2013.01); *H01L 29/7787* (2013.01)

(58) Field of Classification Search
CPC ......... H01L 29/66431; H01L 29/66462; H01L 29/778–29/7789
See application file for complete search history.

(56) References Cited

U.S. PATENT DOCUMENTS 7,271,429 B2    9/2007 Saito et al.
2002/0017648 A1    2/2002 Kasahara et al.
(Continued)

OTHER PUBLICATIONS

Curatola, Gilberto, "High Electron Mobility Transistor with Graded Back-Barrier Region", U.S. Appl. No. 15/352,115, filed Nov. 15, 2016, 1-26.
(Continued)

*Primary Examiner* — Selim U Ahmed
*Assistant Examiner* — Evan G Clinton
(74) *Attorney, Agent, or Firm* — Murphy, Bilak & Homiller, PLLC

(57) ABSTRACT

A method of forming a semiconductor device includes providing a heterojunction semiconductor body. The heterojunction semiconductor body includes a type III-V semiconductor back-barrier region, a type III-V semiconductor channel layer formed on the back-barrier region, and a type III-V semiconductor barrier layer formed on the back-barrier region. A first two-dimensional charge carrier gas is at an interface between the channel and barrier layers. A second two-dimensional charge carrier gas is disposed below the first two-dimensional charge carrier gas. A deep contact structure in the heterojunction semiconductor body that extends through the channel layer and forms an interface with the second two-dimensional charge carrier gas is formed. The first semiconductor region includes a first contact material that provides a conductive path for majority carriers of the second two-dimensional charge carrier gas at the interface with the second two-dimensional charge carrier gas.

21 Claims, 10 Drawing Sheets

(51) Int. Cl.
*H01L 29/205* (2006.01)
*H01L 21/74* (2006.01)
*H01L 29/66* (2006.01)
*H01L 29/778* (2006.01)

(56) References Cited

U.S. PATENT DOCUMENTS

| | | |
|---|---|---|
| 2002/0185655 A1 | 12/2002 | Fahimulla et al. |
| 2005/0189559 A1 | 9/2005 | Saito et al. |
| 2007/0045670 A1 | 3/2007 | Kuraguchi |
| 2009/0146185 A1 | 6/2009 | Suh et al. |
| 2009/0315075 A1 | 12/2009 | Sato |
| 2011/0210377 A1 | 9/2011 | Haeberlen et al. |
| 2013/0075790 A1 | 3/2013 | Hirler et al. |
| 2013/0248874 A1 | 9/2013 | Kuraguchi |
| 2013/0313560 A1 | 11/2013 | Khalil et al. |
| 2013/0313561 A1 | 11/2013 | Suh et al. |
| 2014/0021480 A1 | 1/2014 | Jeon |
| 2014/0097468 A1 | 4/2014 | Okita et al. |
| 2015/0076508 A1* | 3/2015 | Saito ............... H01L 29/4236 257/76 |
| 2015/0236103 A1 | 8/2015 | Kuraguchi |
| 2015/0318387 A1* | 11/2015 | Chiu ............... H01L 23/291 257/76 |
| 2016/0049347 A1 | 2/2016 | Negoro et al. |
| 2017/0271495 A1 | 9/2017 | Yoshioka et al. |
| 2017/0365701 A1 | 12/2017 | Kim et al. |
| 2018/0012960 A1 | 1/2018 | Kinoshita et al. |
| 2019/0096877 A1 | 3/2019 | Kudymov et al. |

OTHER PUBLICATIONS

Curatola, Gilberto, "Semiconductor Device", U.S. Appl. No. 15/336,036, filed Oct. 27, 2016, 1-45.

Kachi, Tetsu et al., "GaN Power Device and Reliability for Automotive Applications", 2012 IEEE International Reliability Physics Symposium (IRPS), Apr. 15-19, 2012, 1-4.

Okita, Hideyuki, et al., "Through Recess and Regrowth Gate Technology for Realizing Process Stability of GaN-Based Gate Injection Transistors", IEEE Transactions on Electron Devices, vol. 64, No. 3, Mar. 2017, pp. 1026-1031.

* cited by examiner

HIGH ELECTRON MOBILITY TRANSISTOR WITH DEEP CHARGE CARRIER GAS CONTACT STRUCTURE

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises near the interface between the AlGaN barrier layer and the GaN channel layer. In an HEMT, the 2DEG forms the channel of the device. Similar principles may be utilized to select channel and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

Due to the high electron mobility of the two-dimensional carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example.

HEMTs may include so-called back-barrier regions beneath the heterostructure portion, i.e., beneath the channel layer. A back-barrier region can be formed from a type III-V semiconductor having a different bandgap as the channel region, e.g., AlGaN in the case of a GaN channel region. Back-barrier regions are used to increase electron confinement in the channel of the device, and consequently shift the threshold voltage of the device. An example of an HEMT with a back-barrier region is disclosed in U.S. application Ser. No. 15/352,115 to Curatola, the content of which is incorporated by reference herein in its entirety.

Although a back-barrier region can improve the performance of an HEMT, one issue with an HEMT design that includes a back-barrier region is the formation of a secondary intrinsic two-dimensional carrier gas (e.g., a 2DHG) at the interface between the channel and back-barrier regions, due to the difference in bandgap between the materials. This secondary intrinsic two-dimensional carrier gas forms an electrically floating channel in the device that can detrimentally impact device reliability.

SUMMARY

A method of forming a semiconductor device is disclosed. According to an embodiment, the method includes providing a heterojunction semiconductor body. The heterojunction semiconductor body includes a type III-V semiconductor back-barrier region, a type III-V semiconductor channel layer formed on the back-barrier region and having a different bandgap as the back-barrier region, and a type III-V semiconductor barrier layer formed on the channel layer and having a different bandgap as the channel layer. A first two-dimensional charge carrier gas is at an interface between the channel and barrier layers. A second two-dimensional charge carrier gas is disposed below the first two-dimensional charge carrier gas. A deep contact structure is formed in the heterojunction semiconductor body. The deep contact structure extends through the channel layer and forms an interface with the second two-dimensional charge carrier gas. The deep contact structure includes a first contact material that provides a conductive path for majority carriers of the second two-dimensional charge carrier gas at the interface with the second two-dimensional charge carrier gas.

A semiconductor device is disclosed. According to an embodiment, the semiconductor device includes a heterojunction semiconductor body. The heterojunction semiconductor body includes a type III-V semiconductor back-barrier region, a type III-V semiconductor channel layer formed on the back-barrier region and having a different bandgap as the back-barrier region, and a type III-V semiconductor barrier layer formed on the channel layer and having a different bandgap as the barrier layer. A first two-dimensional charge carrier gas is formed at an interface between the channel and barrier layers. A second two-dimensional charge carrier gas is disposed beneath the first two-dimensional charge carrier gas. A deep contact structure is formed in the heterojunction semiconductor body. The deep contact structure extends through the channel layer and forms an interface with the second two-dimensional charge carrier gas. The deep contact structure includes a first contact material that provides a conductive path for majority carriers of the second two-dimensional charge carrier gas at the interface with the second two-dimensional charge carrier gas.

According to another embodiment, the semiconductor device includes a heterojunction semiconductor body. The heterojunction semiconductor body includes a type III-V semiconductor back-barrier region, a type III-V semiconductor channel layer formed on the back-barrier region, and a type III-V semiconductor barrier layer formed on the channel layer. A two-dimensional electron gas forms at an interface between the barrier channel layers. A two-dimensional hole gas is disposed below the two-dimensional electron gas. Electrically conductive source and drain electrodes are formed on the heterojunction semiconductor body and in ohmic contact with the two-dimensional electron gas. A gate structure is formed on the heterojunction semiconductor body and configured to control a conductive connection between the source and drain electrodes by controlling a conductive state of the two-dimensional electron gas. A deep contact structure is formed in the heterojunction semiconductor body. The deep contact structure provides an electrical connection that sets a potential of holes in the two-dimensional hole gas to a potential of the source electrode.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, a semiconductor device, which may be configured as an HEMT, includes a deep contact structure that directly interfaces with one or more secondary two-dimensional hole gases (2DHG) of the device. The secondary two-dimensional hole gas is located below the primary two-dimensional electron gas (2DEG) that forms the channel of the device. The deep contact structure provides a conductive connection between an input-output terminal of the device (e.g., a source terminal) and the secondary two-dimensional hole gases. As a result, the deep contact structure sets the secondary two-dimensional hole gas (or gasses) to a fixed potential, e.g., a source potential. This improves the reliability and dynamic performance of the device. In particular, a conductive path for electron-hole recombination between the holes of the two-secondary dimensional hole gas (or gasses) and the electrons of the two-dimensional electron gas is provided. Thus, electron-hole recombination effects are drastically improved in comparison to device with a floating secondary two-dimensional hole gas (or gasses). Moreover, by setting the potential of the secondary two-dimensional hole gas (or gasses) to match the source potential, potentially dangerous electrical gradients underneath the device may be avoided. Furthermore, the charge carrier density of the two-dimensional electron gas between the first and second input-output electrodes during a transition from OFF to ON is reduced. As a result, the dynamic performance of the device (e.g., $R_{DSON}$) is improved.

The deep contact structure can be formed from semiconductor material or metal. In an advantageous method for forming the deep contact structure, a single epitaxial semiconductor layer is used to form both the deep contract structure and a portion of the gate structure that is used to provide a normally-off device.

Figure 1:
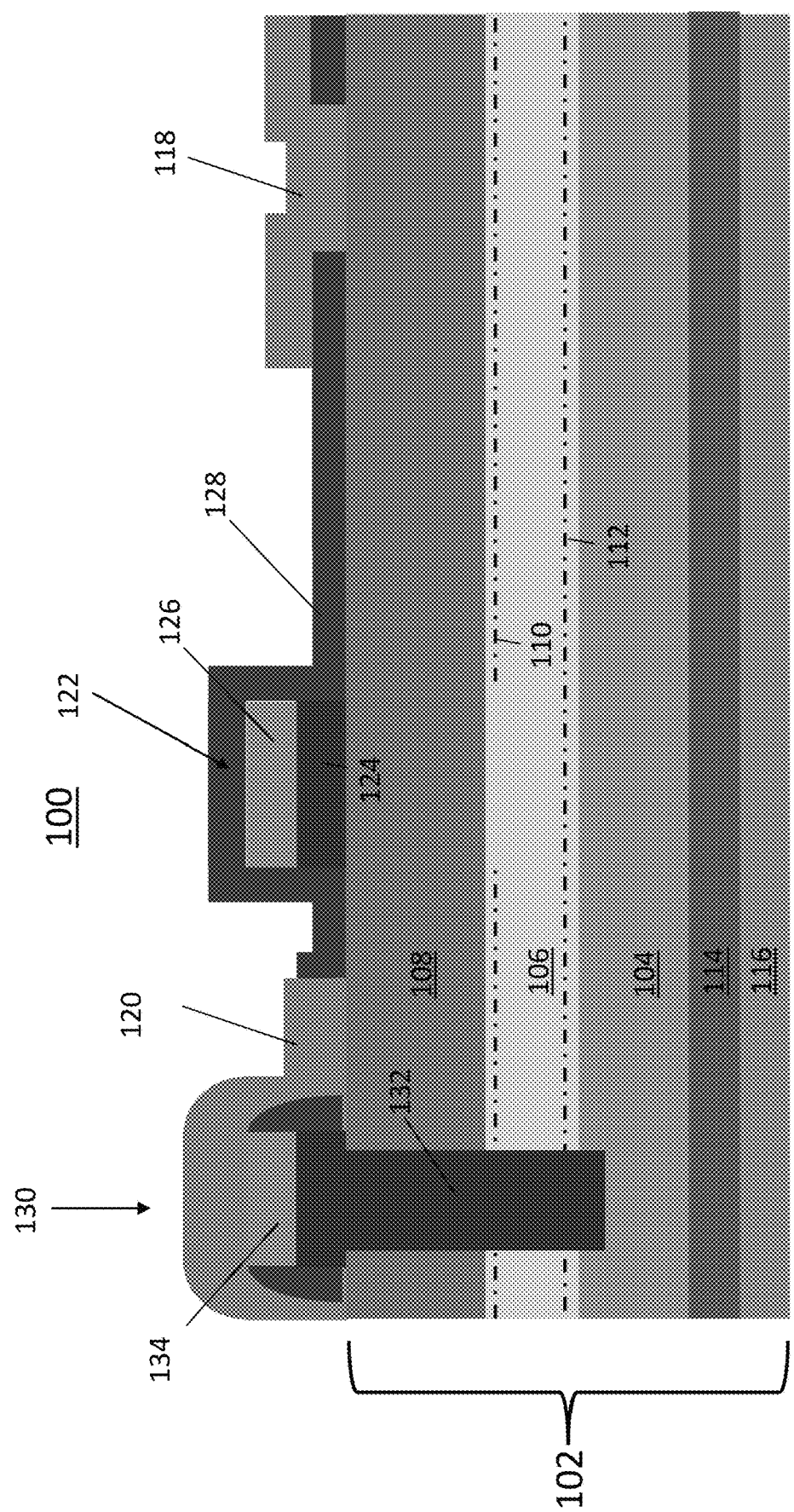
FIG. 1 illustrates a semiconductor device with a deep contact structure, according to an embodiment.

Referring to FIG. 1, a semiconductor device 100 is depicted, according to an embodiment. The semiconductor device 100 includes a heterojunction semiconductor body 102. The heterojunction semiconductor body 102 includes a back-barrier region 104, a channel layer 106 formed on the back-barrier region 104, and a barrier layer 108 formed on the channel layer 106. The barrier layer 108 has a different bandgap as the channel layer 106. Due to this difference in bandgap, a first two-dimensional charge carrier gas 110 intrinsically arises near the interface between the channel layer 106 and the barrier layer 108. In addition, the material of the back-barrier region 104 has a different bandgap as the material of the channel layer 106. Due to this difference in bandgap, a second two-dimensional charge carrier gas 112 intrinsically arises near the interface between the channel layer 106 and the back-barrier region 104. The second two-dimensional charge carrier gas 112 has an opposite majority carrier type as the first two-dimensional charge carrier gas 110. For example, in the case that the first two-dimensional charge carrier gas 110 is a two-dimensional electron gas (2DEG), the second two-dimensional charge carrier gas 112 is a two-dimensional hole gas (2DHG), and vice-versa.

Generally speaking, the channel and barrier layers 106, 108 can be formed from any semiconductor material in which the bandgaps can be manipulated to form the first two-dimensional charge carrier gas 110. Examples of this material includes type III-V semiconductor material (e.g., gallium nitride, gallium arsenide, etc.), wherein a metallic element (e.g., aluminum, indium, etc.) is introduced into the material to adjust the bandgap. The material properties of the back-barrier region 104 (e.g., thickness, bandgap, etc.) are selected to increase carrier confinement in the first two-dimensional charge carrier gas 110 and to prevent device leakage through the lower regions of the heterojunction semiconductor body 102.

The heterojunction semiconductor body 102 additionally includes a transition region 114 and a base substrate 116. The transition region 114 is formed on the base substrate 116, and the back-barrier region 104 is formed on the transition region 114. The base substrate 116 includes a semiconductor material that is suitable for epitaxial growth techniques, e.g., silicon, carbon, silicon carbide, sapphire, etc. The transition region 114 is a so-called lattice transition region 114 that is configured to alleviate mechanical stress that is attributable to crystalline lattice mismatch between type IV semiconductor material of the base substrate 116 (e.g., silicon) and the type III-V semiconductor material of the channel and barrier layers 106, 108 (e.g. GaN, AlGaN). The transition region 114 may include type III-V semiconductor material, metal layers, and electrical insulators, for example. Moreover, the metallic concentration of the transition region 114 may be varied in a way that alleviates mechanical stress, e.g., with a metallic concentration that decreases moving away from the base substrate 116.

According to an embodiment, the heterojunction semiconductor body 102 is a Gallium Nitride (GaN) based semiconductor body. In this embodiment, the base substrate 116 is provided from a commercially available bulk wafer, such as a silicon wafer. Further, in this embodiment, the transition region 114 includes aluminum gallium nitride (AlGaN) with a gradually diminishing aluminum content moving away from the base substrate 116. Alternatively, the transition region 114 can include aluminum nitride (AlN) layers periodically interposed between multiple GaN layers or GaN based layers. Further, in this embodiment, the back-barrier region 104 can be a region of aluminum gallium nitride (AlGaN) with a uniform aluminum content (within process capability) of between two and ten percent, for example, throughout the entire back-barrier region 104. Further, in this embodiment, the channel layer 106 can be an intrinsic layer of pure or essentially pure GaN. Alternatively, the channel layer 106 can include AlGaN with a very low Al content (e.g., less than 10%) and, in addition or in the alternative, may include dopant atoms such as (e.g., carbon or iron). Further, in this embodiment, the barrier layer 108 can be a layer of AlGaN with a higher Al content than the channel layer 106 (e.g., greater than 10%, 15%, 20%, etc.).

The semiconductor device 100 additionally includes a first electrically conductive input-output electrode 118 and a second electrically conductive input-output electrode 120. The first and second input-output electrodes 118, 120 are both formed over the barrier layer 108. The first and second input-output electrodes 118, 120 can include metals, e.g., nickel, copper, titanium, alloys thereof, metal nitrides, e.g., AlN, TiN, and highly doped semiconductors, e.g., polysilicon.

Both of the first and second input-output electrodes 118, 120 are in ohmic contact with the first two-dimensional charge carrier gas 110. This may be provided by direct physical contact between the first and second input-output electrodes 118, 120 and the first two-dimensional charge carrier gas 110. However, as shown in FIG. 1, direct physical contact between the first two-dimensional charge carrier gas 110 and the first and second input-output electrodes 118, 120 is not necessary.

The semiconductor device 100 further includes a gate structure 122. The gate structure 122 is formed on the barrier layer 108 between the first and second input-output electrodes 118, 120. The gate structure 122 includes a second semiconductor region 124 formed on the on the upper surface of the barrier layer 108. The material properties of the second semiconductor region 124 (e.g., doping concentration, thickness, etc.) are selected such that the second semiconductor region 124 applies an electric field (in the absence of any external bias) to the first two-dimensional charge carrier gas 110 that locally depletes the first two-dimensional charge carrier gas 110 underneath the gate structure 122. According to an embodiment, the second semiconductor region 124 includes p-type GaN. The gate structure 122 further includes an electrically conductive gate electrode 126 formed on the doped semiconductor region. The gate electrode 126 can include metals, e.g., nickel, copper, titanium, alloys thereof, metal nitrides, e.g., AlN, TiN, and highly doped semiconductors, e.g., polysilicon.

The semiconductor device 100 further includes a first dielectric layer 128 formed on the heterojunction semiconductor body 102. The first dielectric layer 128 covers and may directly contact the channel layer 106 in the region between the gate structure 122 and the first input-output electrode 118, as well as in the region between the gate structure 122 and the second input-output electrode 120. Exemplary materials that are suitable for the first dielectric layer 128 include silicon nitride (SiN), silicon dioxide ($SiO_2$), and silicon oxynitride ($SiO_xN_y$), or more generally any of a variety of photoresist materials to name a few. According to an embodiment, the first dielectric layer 128 includes $Si_3N_4$.

According to an embodiment, the semiconductor device 100 is configured as a high-electron mobility transistor, wherein the first input-output electrode 118 provides the drain of the device, the second input-output electrode 120 provides the source of the device, and the gate electrode 126 provides a voltage-controlled gate terminal that controls the electrical connection between the source and drain terminals of the device. The first two-dimensional charge carrier gas 110 acts as the channel of the device, and provides a conductive connection between the first and second input-output electrodes 118, 120. A control signal in the form of a voltage is applied to the gate electrode 126 to locally deplete (or repopulate) the first two-dimensional charge carrier gas 110 and consequently complete or disrupt the conductive connection between the first and second input-output electrodes 118, 120. Due to the provision of the second semiconductor region 124, the device is configured as a so-called "normally-off" device. That is, a conductive connection between the first and second input-output electrode 118, 120 does not exist in the absence of a voltage applied to the gate electrode 126, and a sufficient voltage applied to the gate electrode 126 (i.e., the threshold voltage $V_{TH}$) repopulates the depleted region of the first two-dimensional charge carrier gas 110 and therefore completes the conductive connection between the first and second input-output electrodes 118, 120.

The semiconductor device 100 additionally includes a deep contact structure 130. The deep contact structure 130 provides a conductive connection between the second two-dimensional charge carrier gas 112 and the second input-output electrode 120. Due to the electrical connection between a first contact material 132 and the second input-output electrode 120, a low resistance path is provided for the majority carriers present in the second two-dimensional charge carrier gas 112 to flow to and from the second input-output electrode 120. Thus, the potential of the second two-dimensional charge carrier gas 112 is set to the potential of the second input-output electrode 120 by the deep contact structure 130.

The deep contact structure 130 includes the first contact material 132 that extends through the barrier layer 106 and the channel layer 108 and directly interfaces with the second two-dimensional charge carrier gas 112. The first contact material 132 is selected to permit holes from the second two-dimensional charge carrier gas 112 to easily traverse the interface between the first contact material 132 and the second two-dimensional charge carrier gas 112.

In one embodiment, the first contact material 132 includes doped semiconductor material, such as p-type GaN. This material can be appropriately doped to provide a low energy barrier (e.g., no greater than 0.2 eV) to the majority carriers of the two-dimensional charge carrier gas 112. This low energy barrier permits majority carriers of the two-dimensional charge carrier gas 112 to traverse (e.g., via thermionic emission) the interface between the channel layer 108 and the first contact material 132.

In another embodiment, the first contact material 132 includes an electrically conductive metal, such as tungsten, aluminum, copper, titanium, titanium nitride, etc., and alloys thereof. A non-rectifying junction between the second two-dimensional charge carrier gas 112 and the first contact material 132 can be achieved by selecting material that minimizes the barrier width and/or barrier height so that majority carriers of the two-dimensional charge carrier gas 112 can traverse the interface (e.g., via thermionic emission or tunneling effects).

The first contact material 132 of the deep contact structure 130 is electrically connected the second input-output electrode 120. In the depicted embodiment, the deep contact structure 130 further includes a first conductive region 134 that is formed on top of the first contact material 132 and directly contacts the second input-output electrode 120, thus providing the electrical connection between the deep contact structure 130 and the first contact material 132. The first conductive region 134 can include metals, e.g., aluminum, nickel, copper, titanium, alloys thereof, metal nitrides, e.g., AlN, TiN, and highly doped semiconductors, e.g., polysilicon. More generally, the first contact material 132 can be electrically connected to the second input-output electrode 120 in any conventionally known manner, and may optionally directly contact the second input-output electrode 120.

The inventors have studied the impact of the deep contact structure 130 in comparison to a variety corresponding device designs that do not include the deep contact structure 130. That is, the inventors compared the impact of setting the potential of the secondary two-dimensional charge carrier gas (or gasses) to a fixed potential to allowing the secondary two-dimensional charge carrier gas (or gasses) to electrically float. In each device comparison, the inclusion of the deep contact structure 130 beneficially reduces the dynamic drain-source on-state resistance ($R_{DSON}$) performance of the device. This is attributable to the fact that, among other things, the deep contact structure 130 provides a source/sink for free carriers in the back-barrier region 104 to escape during the switching of the device.

Figure 2:
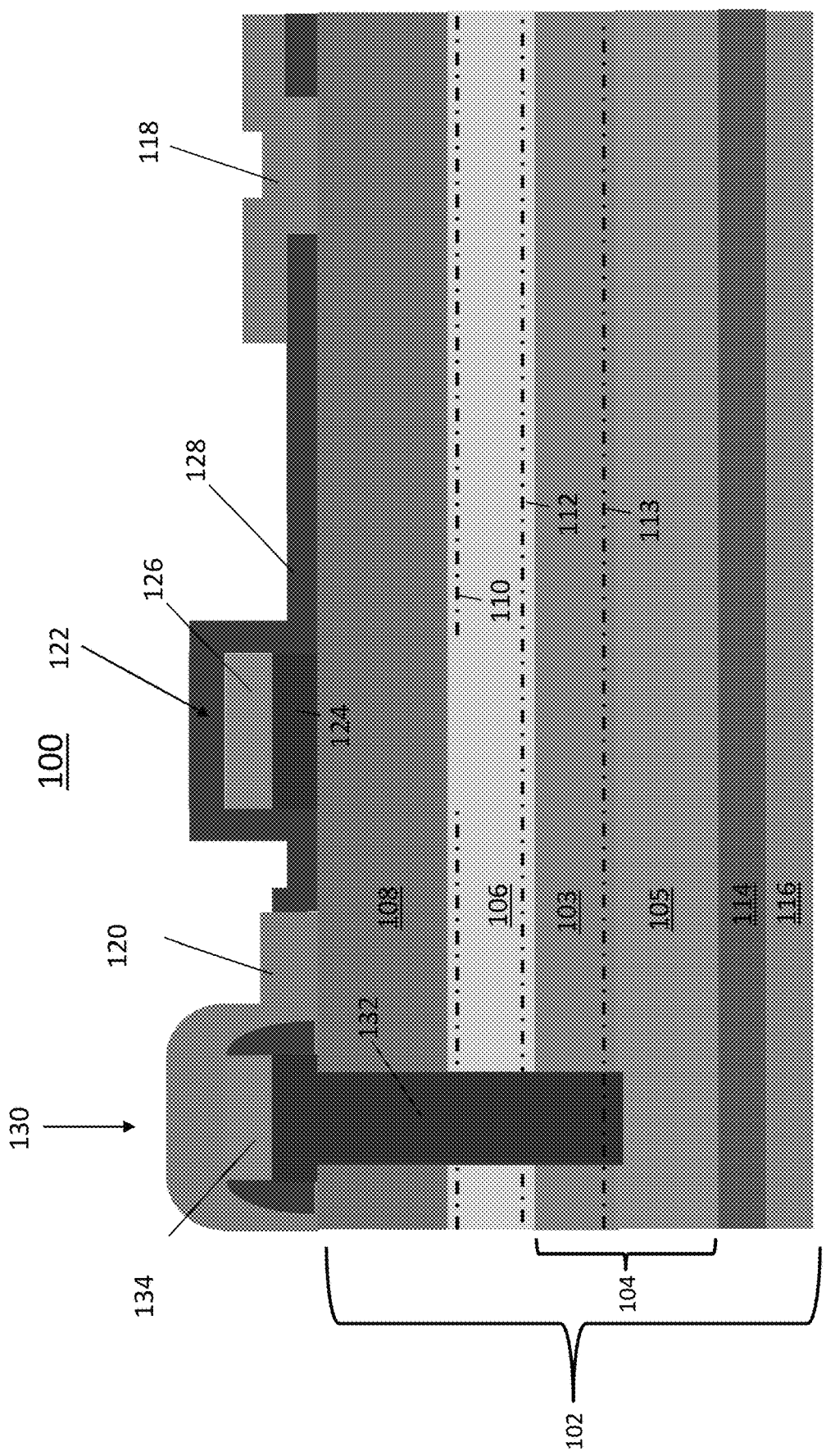
FIG. 2 illustrates a semiconductor device with a deep contact structure, according to another embodiment.

Referring to FIG. 2, the semiconductor device 100 is depicted, according to another embodiment. The semiconductor device 100 of FIG. 2 is identical to the semiconductor device 100 described with reference to FIG. 1, with the exception of the configuration of the back-barrier region 104. In this embodiment, the back-barrier region 104 is a graded back-barrier region. This back-barrier region 104 may be similar or identical to the graded back-barrier region described in U.S. application Ser. No. 15/352,115 to Curatola. According to this design, the back-barrier region 104 includes a first back-barrier region 103 directly beneath the channel region 106, and a second back-barrier region 105 beneath the first back-barrier region 103. The first and second back-barrier regions 103, 105 are each regions of type III-V semiconductor material having different bandgaps from one another. For example, the first back-barrier region 103 can be a first layer of AlGaN and the second back-barrier region 105 can be a second layer of AlGaN with a higher aluminum content than the first back-barrier region 103. An intentionally doped region of AlGaN (e.g., a carbon doped AlGaN region) (not shown) can be provided beneath the second back-barrier region 105. Due to the material configuration of the first and second back-barrier regions 103, 105, two charger carrier gasses form. A second two-dimensional charge carrier gas 112 forms near the interface between the channel region 106 and the first back-barrier region 103. A third two-dimensional charge carrier gas 113 forms near the interface between the first back-barrier region 103 and the second back-barrier region. Due to the material properties of the first and second back-barrier regions 103, 105, the second two-dimensional charge carrier gas 112 is mostly depleted, whereas the third two-dimensional charge carrier gas 113 contains a majority of the free carriers in the back-barrier region 104.

In this embodiment, the deep contact structure 130 is configured such that the first contact material 132 extends through the back-barrier region 104 to reach the third two-dimensional charge carrier gas 113. In this way, the beneficial reduction in the dynamic drain-source on-state resistance ($R_{DSON}$) performance of the device as described above can be obtained.

Figure 3:
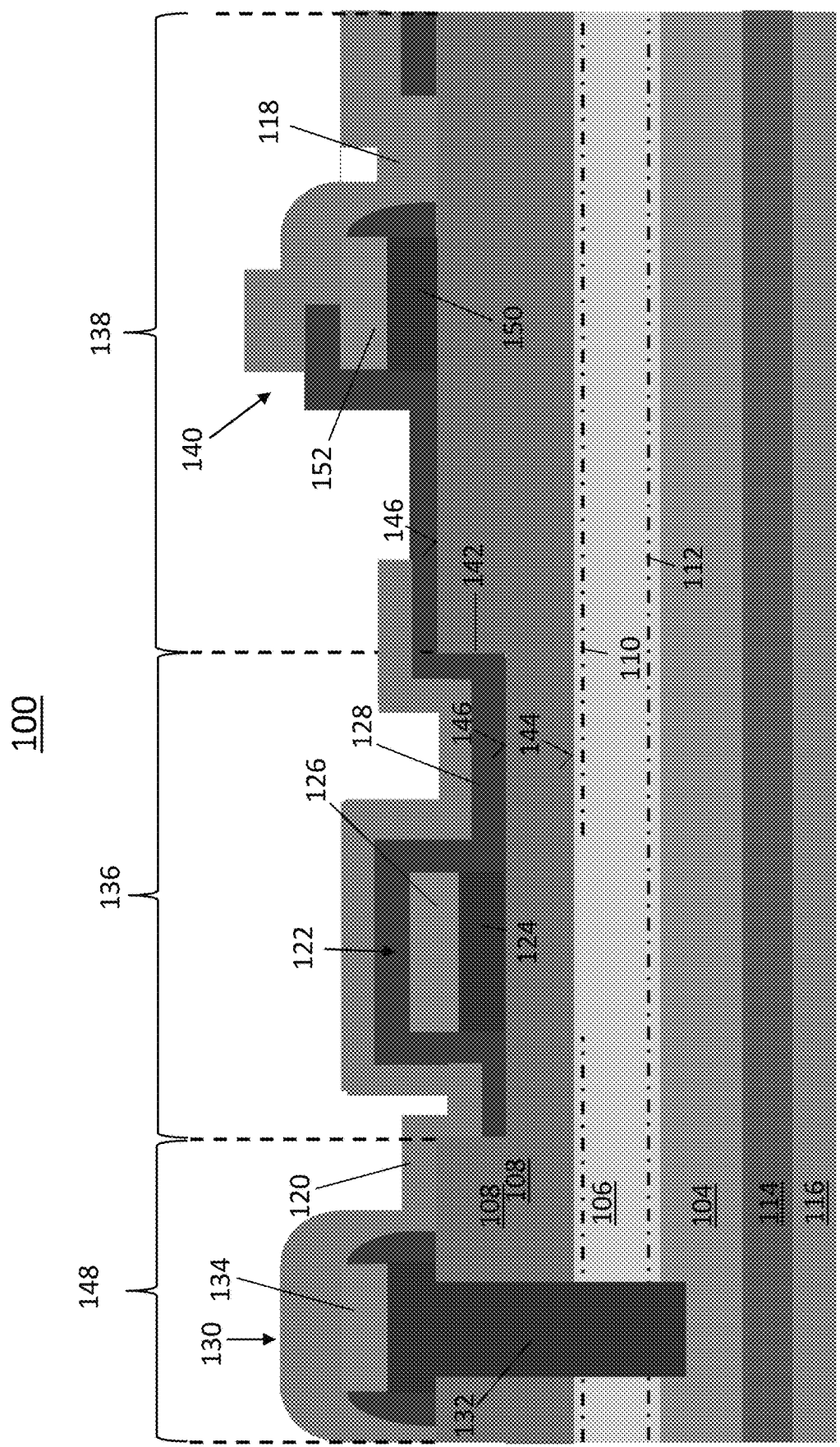
FIG. 3 illustrates a semiconductor device with a deep contact structure, according to another embodiment.

Referring to FIG. 3, the semiconductor device 100 is depicted, according to another embodiment. The semiconductor device 100 of FIG. 3 is identical to the semiconductor device 100 described with reference to FIG. 1, with the following differences. First, in the semiconductor device 100 of FIG. 3, the barrier layer 108 is modified to include a thinner section 136 and a thicker section 138. Second, the semiconductor device 100 of FIG. 3 includes a drain biasing structure 140 between the gate structure 122 and the first input-output electrode 118. Third, in the semiconductor device 100 of FIG. 3, the second input-output electrode 120 extends over the channel and the gate structure 122 to form a field plate structure.

The thinner and thicker sections 136, 138 of the barrier layer 108 are laterally adjacent to one another, with a transition 142 provided between the thicker and thinner sections 136, 138. The thinner section 136 has a first thickness and the thicker section 138 has a second thickness that is greater than the first thickness. The thicknesses of the thinner and thicker sections 136, 138 are measured between a lower surface 144 of the barrier layer 108 that faces the channel layer 106 and an upper surface 146 of the barrier layer 108 that is opposite from the lower surface 144. Exemplary thickness values for the second thickness (i.e., the thickness of the thinner section 136) can be in the range of 5-20 nanometers, for example. Exemplary thickness values for the second thickness (i.e., the thickness of the thicker section 138) can be in the range of 20-50 nanometers, for example. According to an embodiment, one or both of the thinner and thicker sections 136, 138 have a substantially uniform thickness along the entire lateral span of these regions. That is, the upper surface 146 of the barrier layer 108 runs parallel to the lower surface 144 of the barrier layer 108 in one or both of the thinner and thicker sections 136, 138. At the transition 142, the upper surface 146 of the barrier layer 108 is disposed at an oblique angle relative to the immediately adjoining upper surface 146 of the barrier layer 108 in the thinner sections 136. This oblique angle can be a perpendicular angle (i.e., as depicted) or, more generally, any oblique angle (e.g., 30 degrees, 45 degrees, 60 degrees, etc.).

The gate structure 122 is formed on the thinner section 136 of the barrier layer 108 at a location that is laterally spaced apart from the transition 142 between the thicker and thinner sections 136, 138. The first input-output electrode 118 is formed on the thicker section 138 of the barrier layer 108, and may also be laterally spaced apart from the transition 142 between the thicker and thinner sections 136, 138. In the depicted embodiment, the second input-output electrode 120 is formed on a second thicker section 148 of the barrier layer 108 that has the same thickness as the thicker section 138 of the barrier layer 108, i.e., the region that the first input-output electrode 118 is formed on. In other embodiments, the second thicker section 138 can have a third thickness that is different from the second thickness and is greater than the first thickness. In yet other embodiments, the second input-output electrode 120 can be formed on the thinner section 136 of the barrier layer 108. That is, both of the gate structure 122 and the second input-output electrode 120 can be formed on the same thinner section 136 of the barrier layer 108.

The structuring of the barrier layer 108 to include the thinner and thicker sections 136, 138 and the lateral positioning of the gate structure 122, the first input-output electrode 118, and the second input-output electrode 120 in the above described manner produces a device with advantageous properties. By providing the gate structure 122 on the thinner section 136, the gate structure 122 is formed on a portion of the barrier layer 108 with a reduced carrier density in the subjacent first two-dimensional charge carrier gas 110. As a result, the threshold voltage ($V_{TH}$) and drain-source on-state resistance ($R_{DSON}$) can be independently controlled by setting the thicknesses of the thinner and thicker regions 136, 138. Moreover, reliability of the device is provided because the gate structure 122 is exposed to lower electric fields, due to the reduced carrier density of the first two-dimensional charge carrier gas 110.

The drain biasing structure 140 is formed on the thicker section 138 of the barrier layer 108 between the transition 142 and the first input-output electrode 118. The drain biasing structure 140 includes a third semiconductor region 150 that is formed on the upper surface 146 of the barrier layer 108. The third semiconductor region 150 can include semiconductor material of the same type and doping concentration as the second semiconductor region 124 and the first contact material 132 (e.g., p-type GaN). The drain biasing structure 140 additionally includes an electrically conductive connection between the third semiconductor region 150 and the first input-output electrode 118. Thus, the third semiconductor region 150 is set to the same potential as the first input-output electrode 118 (e.g., the drain potential). In the depicted embodiment, the drain biasing structure 140 includes a third conductive region 152 that is formed on top of the third semiconductor region 150. The third conductive region 152 can include metals, e.g., aluminum, nickel, copper, titanium, alloys thereof, metal nitrides, e.g., AlN, TiN, and highly doped semiconductors, e.g., polysilicon. In the depicted embodiment, the first input-output electrode 118 is formed on a portion of the third conductive region 152 that is exposed from the first dielectric layer 128 and thus directly contacts the third conductive region 152. Thus, an electrical connection between the third semiconductor region 150 and the first input-output electrode 118 is provided by the third conductive region 152. More generally, the third semiconductor region 150 can be electrically connected to the first input-output electrode 118 in any conventionally known manner, and may optionally directly contact that first input-output electrode 118.

During operation of the semiconductor device 100, the drain biasing structure 140 injects holes into the barrier and channel layers 108, 106. In doing so, dynamic switching losses caused by charge traps and/or lattice defects are mitigated.

Referring to FIGS. 4-10, selected process steps for forming the semiconductor device 100 are shown, according to an embodiment. These steps, in combination with conventionally known processing methods (not shown), can be used to form the semiconductor device 100 according to any one of the embodiments described with reference to FIGS. 1-3.

Figure 4:
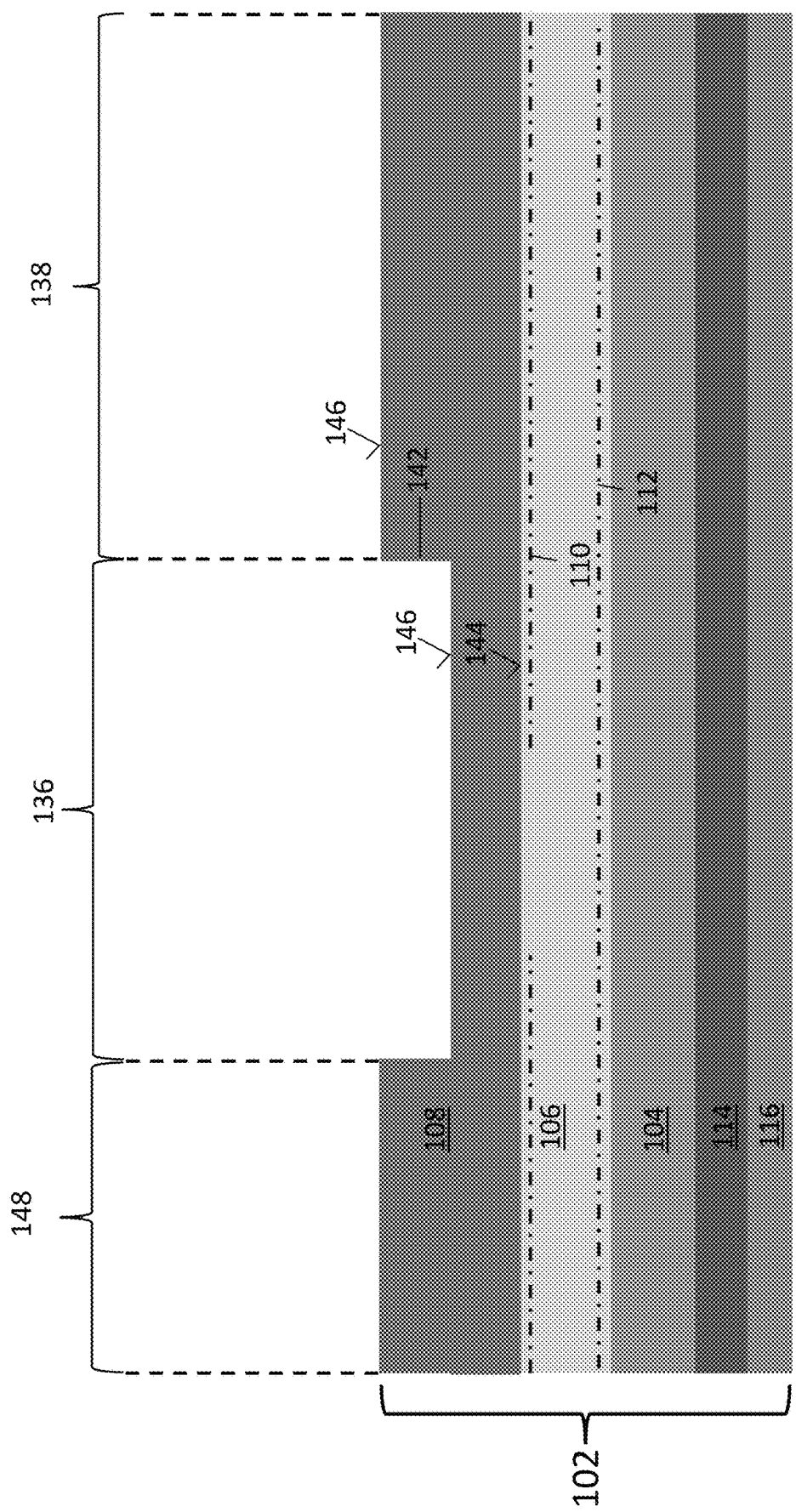
FIG. 4 illustrates providing a heterostructure semiconductor body, in a method of forming a semiconductor device, according to an embodiment.

Referring to FIG. 4, the heterostructure semiconductor body 102 is provided. According to an embodiment, the heterostructure semiconductor body 102 is formed using an epitaxial growth technique. According to this process, the base substrate 116 is initially provided. The base substrate 116 can be provided from a commercially available bulk semiconductor wafer (e.g., a silicon wafer) or alternatively can be provided from epitaxially grown material. After providing the base substrate 116, a nucleation layer (not shown) can be formed on the base substrate 116. The nucleation layer can be a thin (e.g., in the range of tens to hundreds of nm) layer of material that is conducive to the growth of type III-V semiconductor thereon. An example of such a material is AlN (aluminum nitride). After forming the nucleation layer, the transition region 114, the back-barrier region 104, the channel layer 106, and the barrier layer 108 can each be formed successively using epitaxial deposition techniques. The metallic content and/or doping concentration of each of these layers can be controlled during the epitaxial deposition of these layers to achieve the values previously described. Additional doping steps may be performed after the completion of any one of the transition region 114, the back-barrier region 104, the channel layer 106, and the barrier layer 108.

In the above described epitaxial growth process, the barrier layer 108 is grown with a uniform thickness. Subsequently, a further processing step is performed to structure the barrier layer 108 to have the thinner and thicker sections 136, 138.

According to one embodiment, the further processing step that is performed to structure the barrier layer 108 to have the thinner and thicker sections 136, 138 includes a masked etching sequence. According to this technique, the barrier layer 108 is initially formed with a thickness corresponding to the first thickness (e.g., between about 10-50 nm). A first mask (not shown) is formed on the upper surface 146 of the barrier layer 108. The first mask is patterned (e.g., using known photolithography techniques) in the desired geometry of the thicker section 138. The material of the first mask is configured to permit etching of the barrier layer 108 selective to the first mask. Exemplary materials for the first mask include silicon nitride (SiN), silicon dioxide ($SiO_2$), and silicon oxynitride ($SiO_xN_y$), or more generally any of a variety of photoresist materials to name a few. After the patterning of the first mask, an etching process is performed to remove semiconductor material from the portion of the barrier layer 108 that is exposed form the first mask. According to an embodiment, an anisotropic etching process, such as an anisotropic wet chemical etch process, is used to remove semiconductor material. The etching process is carried out until the etched region has the second thickness (e.g., between 5 and 20 nm).

According to another embodiment, the further processing step that is performed to structure the barrier layer 108 to have the thinner and thicker sections 136, 138 includes a two-step epitaxial growth process. According to this technique, the barrier layer 108 is initially formed have the second thickness (e.g., between 5 and 10 nm). Subsequently, a mask is formed on the upper surface 146 of the barrier layer 108 and patterned to cover the desired area of the thinner section 136. The mask is formed from an epitaxial growth inhibiting material such as silicon dioxide ($SiO_2$), for example. Subsequently, an epitaxial deposition process is performed whereby the same material as the barrier layer 108 (e.g., AlGaN) is formed on the unmasked portion of the barrier layer 108. This epitaxial deposition process is performed until the unmasked portion of the barrier layer 108 has the first thickness.

Figure 5:
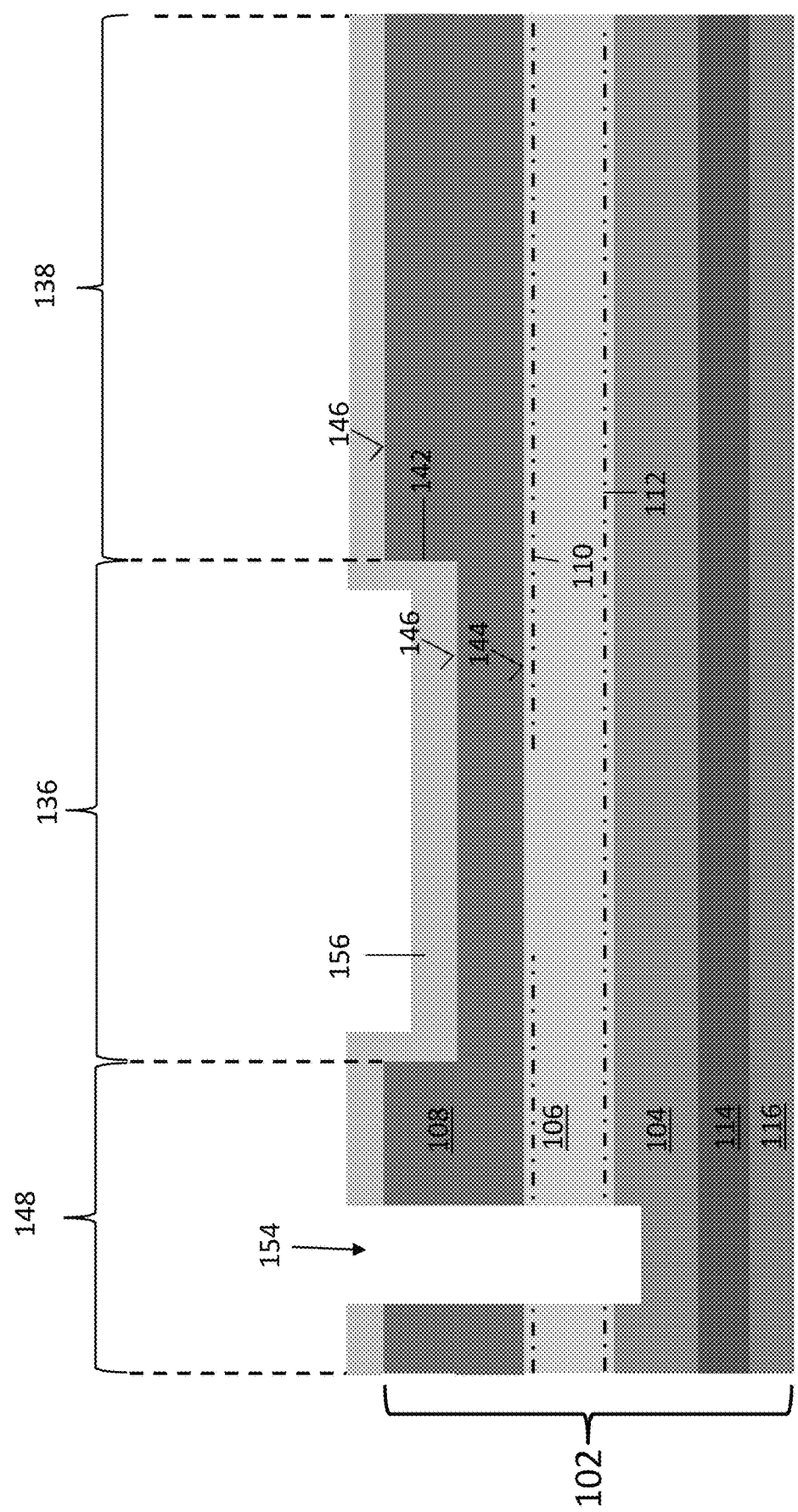
FIG. 5 illustrates forming a contact trench in the heterostructure semiconductor body, in a method of forming a semiconductor device, according to an embodiment.

Referring to FIG. 5, after the heterostructure semiconductor body 102 has been provided, a contact trench 154 for the deep contact structure 130 is formed. According to an embodiment, the contact trench 154 is formed using a masked etching technique. According to this technique, a second mask 156 is formed on the upper surface 146 of the barrier layer 108. Exemplary materials for the second mask 156 include silicon nitride (SiN), silicon dioxide ($SiO_2$), and silicon oxynitride ($SiO_xN_y$), or more generally any of a variety of photoresist materials to name a few. The second mask 156 is patterned in the desired geometry of the deep contact structure 130. After the patterning of the second mask 156, an etching process is performed to remove semiconductor material from portions of the barrier and channel layers 108, 110. The etching process is carried out until the contact trench 154 reaches the back-barrier region 104.

Figure 6:
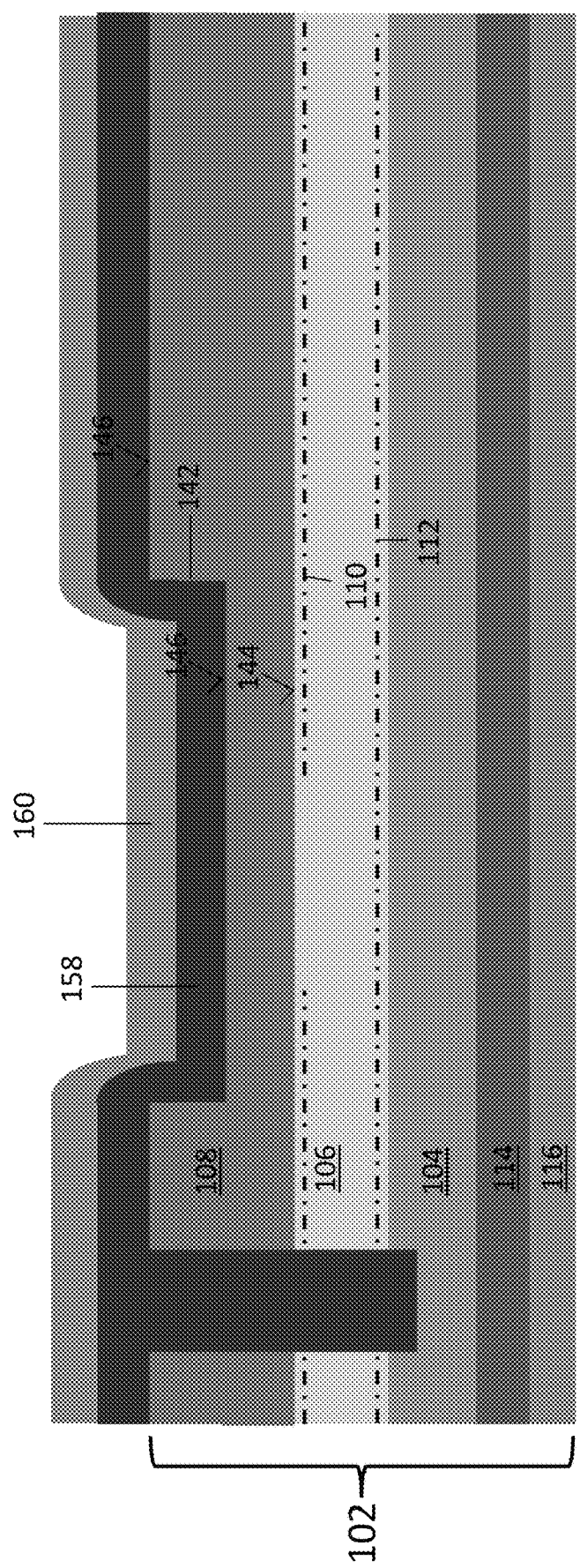
FIG. 6 illustrates forming a doped semiconductor layer and a metal layer on the heterostructure semiconductor body, in a method of forming a semiconductor device, according to an embodiment.

Referring to FIG. 6, after forming the contact trench 154 and removing the second mask 156, a multi-layer deposition step is performed. According to this process, a first layer of doped semiconductor material 158 is formed on the exposed surfaces of the heterostructure semiconductor body 102. This can be done using an epitaxial growth process. The first layer of doped semiconductor material 158 has the opposite doping type as the majority carriers of the first two-dimensional charge carrier gas 110 and the same doping type as the majority carriers of the second two-dimensional charge carrier gas 112. For example, in the case of the AlGaN/GaN/AlGaN heterostructure semiconductor body 102 as previously described, the first layer of doped semiconductor material 158 includes p-type GaN. The first layer of doped semiconductor material 158 is grown such that it completely fills the contact trench 154 and covers the upper surface 146 of the barrier layer 108, including the thinner section 136, the thicker section 138, and the transition 142. The First layer of doped semiconductor material 158 may have a total (net) doping concentration of about $1e^{19}/cm^3$ with a concentration of first conductivity type (e.g., p-type) dopants in the range of $1e^{19}/cm^3$ of about $1e^{17}/cm^3$.

After forming the first layer of doped semiconductor material 158, a first conductive layer 160 is formed on top of the first layer of doped semiconductor material 158. This can be done using a deposition technique, such as electroless deposition or electroplating. The material of the first conductive layer 160 corresponds to the material of the first, second and third conductive regions 134, 126, and 152 as previously described, i.e., aluminum, nickel, copper, titanium, etc., metal nitrides, e.g., AlN, TiN, etc., and alloys thereof.

Figure 7:
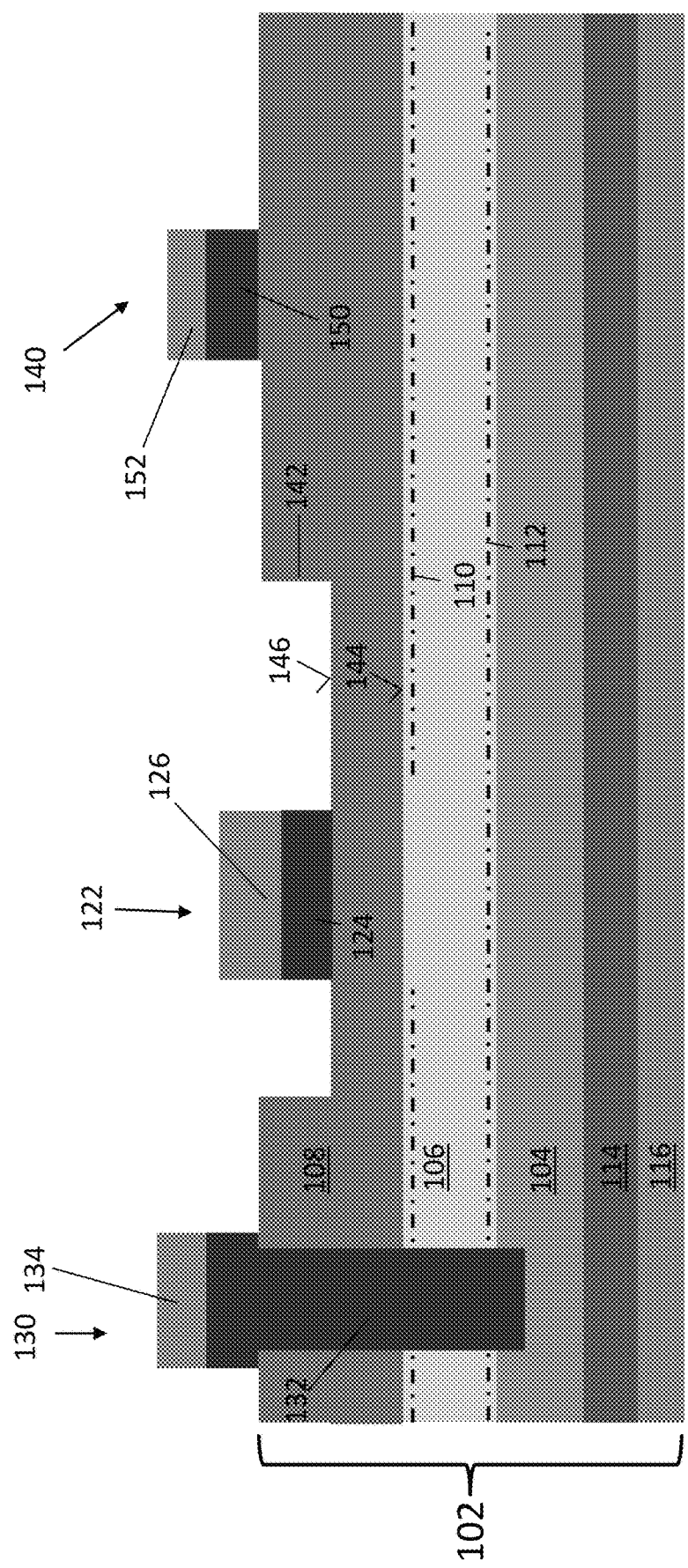
FIG. 7 illustrates structuring the doped semiconductor layer and the metal layer, in a method of forming a semiconductor device, according to an embodiment.

Referring to FIG. 7, after forming the first layer of doped semiconductor material 158 and the first conductive layer 160, a common lithography step is performed to structure the first layer of doped semiconductor material 158 and the first conductive layer 160 into discrete regions. According to this technique, a third mask (not shown) is formed over the first conductive layer 160 and patterned in the desired geometry of the gate structure 122, the drain biasing structure 140, and the deep contact structure 130. Subsequently, an etching process is carried out whereby portions of the first layer of doped semiconductor material 158 and the first conductive layer 160 that are exposed from the third mask are etched away. This etching process can be a multi-step process whereby a different etchant chemical is used to remove the first layer of doped semiconductor material 158 and the first conductive layer 160. As a result, the upper surface 146 of the barrier layer 108 between the gate structure 122, the drain biasing structure 140 and the deep contact structure 130 is exposed.

Figure 8:
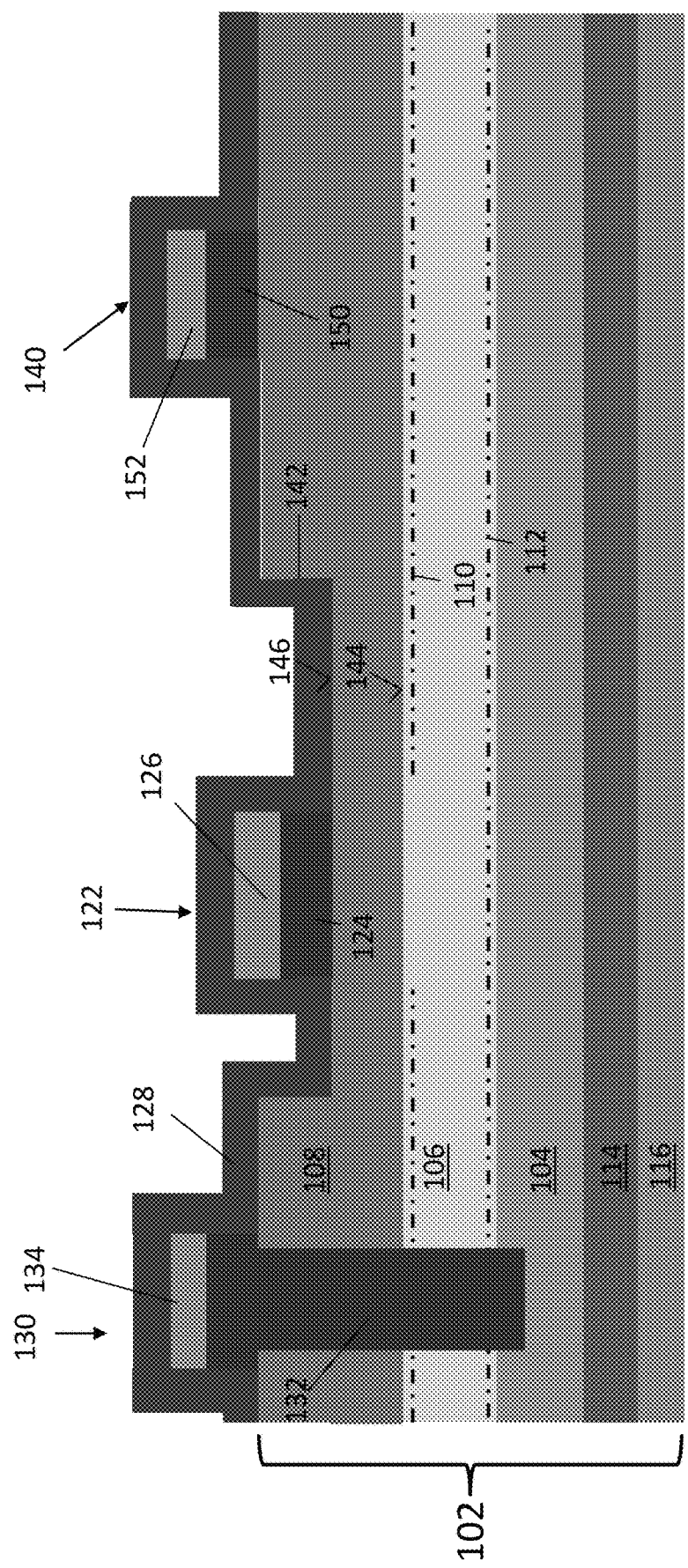
FIG. 8 illustrates forming a first dielectric layer on the structured regions, in a method of forming a semiconductor device, according to an embodiment.

Referring to FIG. 8, after structuring the first layer of doped semiconductor material 158 and the first conductive layer 160, the first dielectric layer 128 is formed. This can be done using a deposition technique, such as chemical vapor deposition (CVD), for example. The first dielectric layer 128 is conformally deposited so as to cover the gate structure 122, the drain biasing structure 140 and the deep contact structure 130 as well as the exposed upper surface 146 of the barrier layer 108 in between these structures.

Figure 9:
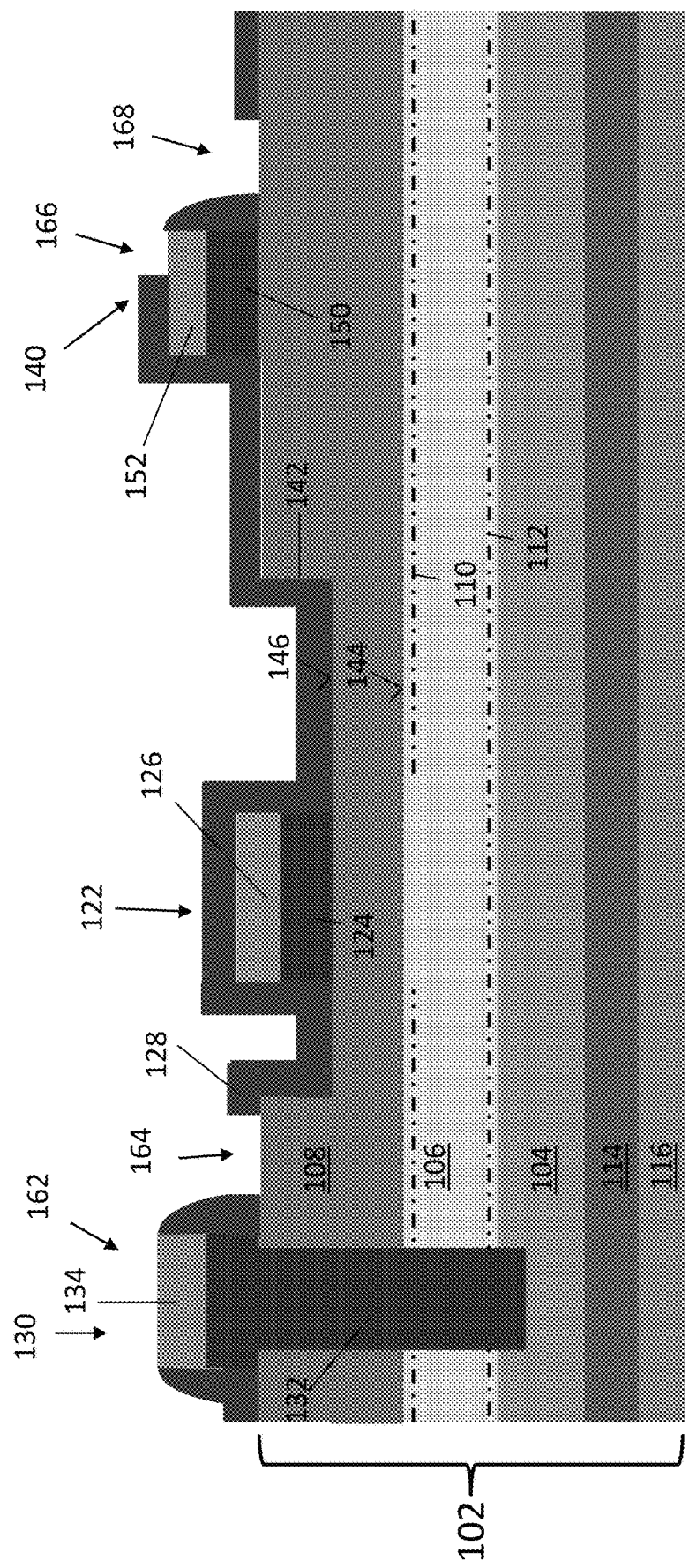
FIG. 9 illustrates patterning the first dielectric layer to form contact openings, in a method of forming a semiconductor device, according to an embodiment.

Referring to FIG. 9, after forming the first dielectric layer 128, the first dielectric layer 128 is patterned to include first, second, third and fourth openings 162, 164, 166, 168. This may be done using a masked etching technique whereby a fourth mask (not shown) is provided over the first dielectric layer 128 and patterned in the desired geometry of the include first, second, third and fourth openings 162, 164, 166, 168. Subsequently, the exposed material of the first dielectric layer 128 is etched away. The first opening 162 is formed directly over the deep contact structure 130. The second opening 164 exposes the upper surface 146 of the barrier layer 108 between the deep contact structure 130 and the gate structure 122. The third opening 166 is formed to partially overlap with the drain biasing structure 140 so as to expose an upper surface portion of the third conductive region 152 and a portion of the heterostructure semiconductor body 102 that is immediately adjacent to the drain biasing structure 140. The fourth opening 168 exposes the upper surface 146 of the barrier layer 108 at a location that is near the drain biasing structure 140.

Figure 10:
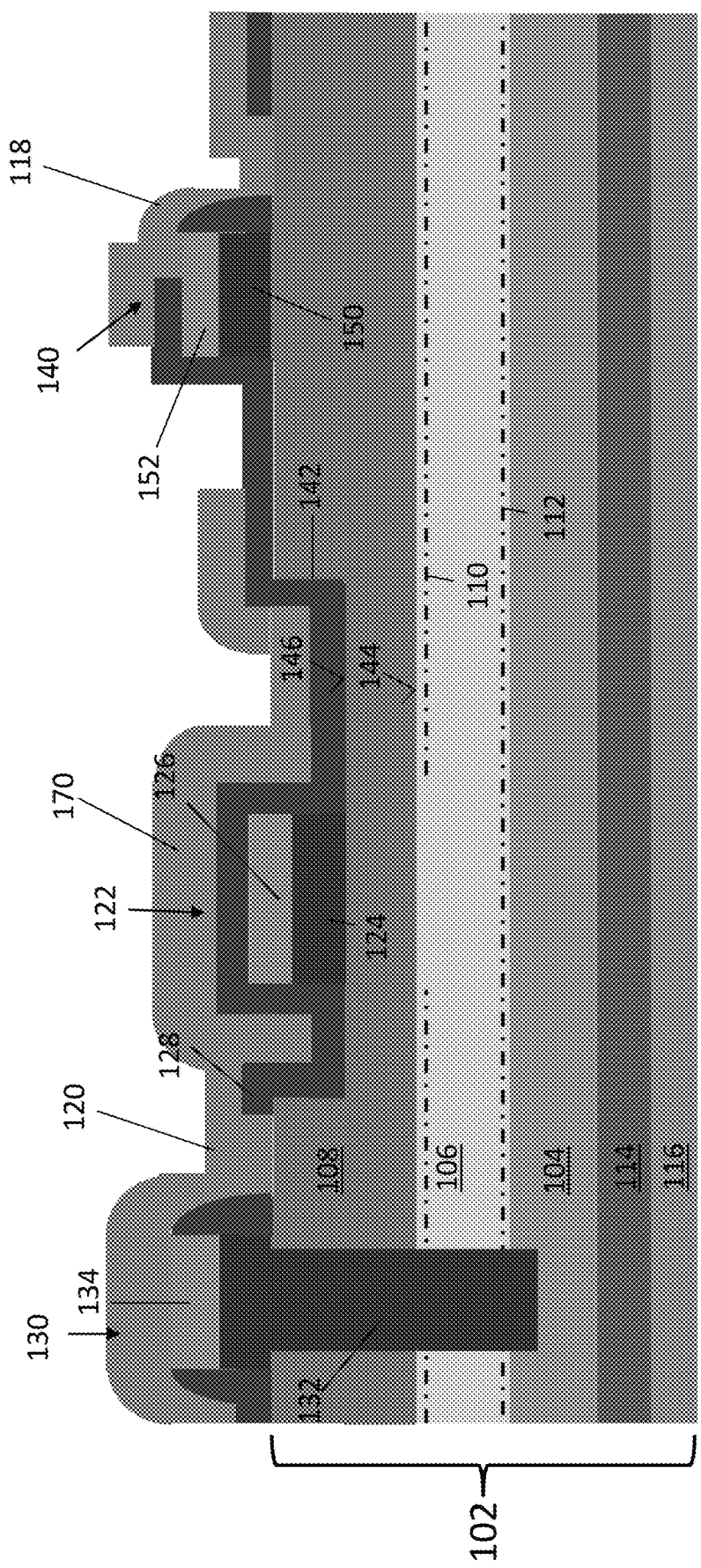
FIG. 10 illustrates forming first and second input-output electrodes in the contact openings, in a method of forming a semiconductor device, according to an embodiment.

Referring to FIG. 10, a second electrically conductive layer 170 is formed on the patterned first dielectric layer 128. This can be done using any of a variety of deposition techniques, including electroplating, electroless deposition, and epitaxy. The material of the second electrically conductive layer 170 can include metals, e.g., nickel, copper, titanium, alloys thereof, metal nitrides, e.g., AlN, TiN, and highly doped semiconductors, e.g., polysilicon.

As a result, the first and second input-output electrode 118, 120 are formed. The first and second input-output electrodes 118, 120 contact the third conductive region 152 and the first conductive region 134, respectively, and therefore form a direct electrical connection between the two. A gate connection pad can be formed form the second electrically conductive layer 170 by forming another opening (not shown) in another cross-sectional region another cross-sectional view and depositing this second electrically conductive layer 170 in this other opening.

The technique described with reference to FIGS. 4-10 illustrate an example for forming the semiconductor device 100 described with reference to FIG. 3 that includes both the structured barrier layer with the thinner and thicker sections 136, 138. A corresponding semiconductor device 100 that does not include either one or both of these features can be formed by omitting the relevant steps (e.g., the further processing of the type III-V semiconductor layer described with reference to FIG. 3) and/or by appropriately performing the lithography steps (e.g., the mask deposition and etching steps described with reference to FIG. 6) to omit these structures.

The above described processing steps advantageously provide a reliable and cost-effective method for forming the semiconductor device 100. One particular advantage of the method is reduced process complexity by forming several of the device features together using common lithography steps. In particular, as described with reference to FIGS. 6-7 the deep contact structure 130, the gate structure 122 and the drain biasing structure 140 are formed by a common process whereby a single layer of doped type III-V semiconductor material and a single layer of conductive material is used to form the doped semiconductor and metal regions for each of these structures, respectively, and a single mask is used to define each of these features.

In the above described embodiments, the transition region 114, the back-barrier region 104, the channel layer 106, and the barrier layer 108 are described as being regions of AlGaN, AlGaN, AlGaN, and AlGaN, respectively. These materials are used for illustrative purposes only. More generally, any of a variety of combinations of III-V semiconductor materials can be used to provide the device concept described herein. Examples of these III-V semiconductor materials for these regions include any III-nitride based compound semiconductor material. For example, GaN may be combined with AlGaN or InGaN to form an electron gas inversion region as the channel. The semiconductor device 100 may have AlInN/AlN/GaN barrier/spacer/channel layer structures. In general, the normally-off compound semiconductor transistor can be realized using any suitable III-nitride technology such as GaN that permits the formation of opposite polarity inversion regions due to piezoelectric effects. In a broad sense, the compound semiconductor transistors described herein can be formed from any binary, ternary or quaternary III-nitride compound semiconductor material where piezoelectric effects are responsible for the device concept.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together, e.g. a connection via a metal and/or highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, the method comprising:
   providing a heterojunction semiconductor body, the heterojunction semiconductor body comprising:
      a type III-V semiconductor back-barrier region;
      a type III-V semiconductor channel layer formed on the back-barrier region and having a different bandgap as the back-barrier region;
      a type III-V semiconductor barrier layer formed on the channel layer and having a different bandgap as the channel layer;
      a first two-dimensional charge carrier gas formed at an interface between the channel and barrier layers; and
      a second two-dimensional charge carrier gas disposed below the first two-dimensional charge carrier gas;
   forming a deep contact structure in the heterojunction semiconductor body that extends through the channel layer and comprises a first contact material that forms a direct interface with the second two-dimensional charge carrier gas,
   wherein the first contact material provides a conductive path for majority carriers of the second two-dimensional charge carrier gas to traverse the direct interface between the first contact material and the second two-dimensional charge carrier gas.

2. The method of claim 1, further comprising:
   forming first and second electrically conductive input-output electrodes on the heterojunction semiconductor body, the first and second input-output electrodes each being in ohmic contact with the first two-dimensional charge carrier gas; and
   forming a gate structure on the heterojunction semiconductor body, the gate structure being configured to control a conductive connection between the first and second input-output electrodes,
   wherein the first contact material of the deep contact structure is directly electrically connected to the second input-output electrode.

3. The method of claim 2, wherein the gate structure comprises a second semiconductor region formed on an upper surface of the barrier layer and an electrically conductive gate electrode formed on the second semiconductor region, wherein the second semiconductor region is configured to locally deplete the first two-dimensional charge carrier gas such that the semiconductor device is normally-off.

4. The method of claim 3, wherein the back-barrier region and the barrier layer each comprise aluminum gallium nitride, wherein the channel layer comprises gallium nitride, wherein the first two-dimensional charge carrier gas is a two-dimensional electron gas, wherein the second two-dimensional charge carrier gas is a two-dimensional hole gas, and wherein the first contact material is p-type gallium nitride.

5. The method of claim 3, wherein the first contact material of the deep contact structure comprises electrically conductive metal.

6. The method of claim 3, wherein the first contact material of the deep contact structure comprises a first semiconductor material that is doped.

7. The method of claim 6, wherein the first contact material of the deep contact structure and the second semiconductor region are formed together from a first layer of the first semiconductor material that is deposited on the heterojunction semiconductor body and subsequently patterned in a common lithography step.

8. The method of claim 7, further comprising forming a drain biasing structure, the drain biasing structure comprising: a third semiconductor region disposed on the upper surface of the barrier layer between the gate structure and the first input-output electrode, and an electrically conductive connection between the third semiconductor region and the first input-output electrode, wherein the third semiconductor region is formed together with the first contact material of the deep contact structure and the second semiconductor region from the first layer of the first semiconductor material that is epitaxially grown on the heterojunction semiconductor body and subsequently patterned in the common lithography step.

9. The method of claim 1, wherein the type III-V semiconductor back-barrier region comprises a first back-barrier region and a second back-barrier region, the first back-barrier region being formed directly underneath the type III-V semiconductor channel layer, the second back-barrier region being formed underneath the first second back-barrier region, wherein a third two-dimensional charge carrier gas forms near an interface between the first and second back-barrier regions, and wherein the deep contact structure forms an interface with the third two-dimensional charge carrier gas.

10. The method of claim 1, wherein the barrier layer comprises a thicker section and a thinner section, wherein the gate structure is formed on the thinner section, wherein the first input-output electrode is formed on the thicker section, and wherein the gate structure is laterally spaced apart from a transition between the thicker and thinner sections.

11. A semiconductor device, comprising:
a heterojunction semiconductor body, the heterojunction semiconductor body comprising:
a type III-V semiconductor back-barrier region;
a type III-V semiconductor channel layer formed on the back-barrier region and having a different bandgap as the back-barrier region;
a type III-V semiconductor barrier layer formed on the channel layer and having a different bandgap as the channel layer;
a first two-dimensional charge carrier gas formed at an interface between the channel and barrier layers; and
a second two-dimensional charge carrier gas disposed beneath the first two-dimensional charge carrier gas;
a deep contact structure formed in the heterojunction semiconductor body that extends through the channel layer and comprises a first contact material that forms a direct interface with the second two-dimensional charge carrier gas,
wherein the first contact material provides a conductive path for majority carriers of the second two-dimensional charge carrier gas to traverse the direct interface between the first contact material and the second two-dimensional charge carrier gas.

12. The semiconductor device of claim 11, wherein the first contact material is a doped type III-V semiconductor material, wherein a majority carrier type of the doped type III-V semiconductor material is the same as a majority carrier type of the second two-dimensional charge carrier gas.

13. The semiconductor device of claim 12, wherein the back-barrier region and barrier layers comprise aluminum gallium nitride, wherein the channel layer comprises gallium nitride, wherein the first two-dimensional charge carrier gas is a two-dimensional electron gas, wherein the second two-dimensional charge carrier gas is a two-dimensional hole gas, and wherein the doped type III-V semiconductor material is p-type gallium nitride.

14. The semiconductor device of claim 12, further comprising:
first and second input-output electrically conductive electrodes on the heterojunction semiconductor body, the first and second input-output electrodes each being in ohmic contact with the first two-dimensional charge carrier gas; and
a gate structure on the heterojunction semiconductor body, the gate structure being configured to control a conductive connection between the first and second input-output electrodes,
wherein the first semiconductor region of the deep contact structure is directly electrically connected to the second input-output electrode.

15. The semiconductor device of claim 14, wherein the gate structure comprises a second semiconductor region formed on an upper surface of the barrier layer and an electrically conductive gate electrode formed on the second semiconductor region, wherein the second semiconductor region is configured to locally deplete the first two-dimensional charge carrier gas so as to block a conductive connection between the first and second input-output electrodes without any bias applied to the gate electrode, and wherein the second semiconductor region comprises the doped type III-V semiconductor material.

16. The semiconductor device of claim 11, wherein the first contact material of the deep contact structure comprises electrically conductive metal.

17. The semiconductor device of claim 11, wherein the type III-V semiconductor back-barrier region comprises a first back-barrier region and a second back-barrier region, the first back-barrier region being formed directly underneath the type III-V semiconductor channel layer, the second back-barrier region being formed underneath the first second back-barrier region, wherein a third two-dimensional charge carrier gas forms near an interface between the first and second back-barrier regions, and wherein the deep contact structure forms an interface with the third two-dimensional charge carrier gas.

18. The semiconductor device of claim 11, wherein the barrier layer comprises a thicker section and a thinner section, wherein the gate structure is formed on the thinner section, wherein the first input-output electrode is formed on the thicker section, and wherein the gate structure is laterally spaced apart from a transition between the thicker and thinner sections.

19. A semiconductor device, comprising:
a heterojunction semiconductor body, comprising: a type III-V semiconductor back-barrier region, a type III-V semiconductor channel layer formed on the back-barrier region, and a type III-V semiconductor barrier layer formed on the channel layer, a two-dimensional electron gas that forms at an interface between the barrier channel layers, a two-dimensional hole gas that forms at an interface between the channel and back-barrier regions,
electrically conductive source and drain electrodes formed on the heterojunction semiconductor body and in ohmic contact with the two-dimensional electron gas;
a gate structure formed on the heterojunction semiconductor body and configured to control a conductive connection between the source and drain electrodes by controlling a conductive state of the two-dimensional electron gas;
a deep contact structure formed in the heterojunction semiconductor body,
wherein the deep contact structure provides an electrical connection that sets a potential of holes in the two-dimensional hole gas to a potential of the source electrode.

20. The semiconductor device of claim 19, wherein the source electrode is in ohmic contact with the two-dimensional electron gas, and wherein the deep contact structure comprises a semiconductor region that interfaces with the second two-dimensional charge carrier gas and is electrically connected to the source electrode.

21. The semiconductor device of claim 19, wherein the source electrode is in ohmic contact with the two-dimensional electron gas, and wherein the deep contact structure comprises a conductive metal that interfaces with the second two-dimensional charge carrier gas and is electrically connected to the source electrode.

* * * * *